US007634688B2

(12) United States Patent
Madter et al.

(10) Patent No.: US 7,634,688 B2
(45) Date of Patent: Dec. 15, 2009

(54) SYSTEM AND METHOD FOR AUTOMATICALLY SAVING MEMORY CONTENTS OF A DATA PROCESSING DEVICE ON POWER FAILURE

(75) Inventors: Richard C. Madter, Puslinch (CA); Karin Alicia Werder, Kitchener (CA); Wei Yao Huang, Kitchener (CA)

(73) Assignee: Research In Motion Limited, Waterloo (CA)

( * ) Notice: Subject to any disclaimer, the term of this patent is extended or adjusted under 35 U.S.C. 154(b) by 577 days.

(21) Appl. No.: 10/960,950

(22) Filed: Oct. 12, 2004

(65) Prior Publication Data
US 2006/0072369 A1 Apr. 6, 2006

(30) Foreign Application Priority Data
Oct. 4, 2004 (EP) .................................. 04104845

(51) Int. Cl.
*G06F 11/00* (2006.01)
(52) U.S. Cl. .............................. 714/24; 714/5; 714/14; 714/52
(58) Field of Classification Search .................. 714/24, 714/52, 5, 14
See application file for complete search history.

(56) References Cited

U.S. PATENT DOCUMENTS

| 4,959,774 | A | * | 9/1990 | Davis ............................. 714/6 |
| 5,204,963 | A | * | 4/1993 | Noya et al. .................. 365/229 |
| 5,412,612 | A | | 5/1995 | Oyama |
| 5,448,719 | A | * | 9/1995 | Schultz et al. .................. 714/5 |
| 5,515,333 | A | * | 5/1996 | Fujita et al. .................. 365/229 |
| 5,519,831 | A | * | 5/1996 | Holzhammer ................. 714/22 |
| 5,586,291 | A | * | 12/1996 | Lasker et al. ................. 711/113 |
| 5,708,820 | A | * | 1/1998 | Park et al. ..................... 713/323 |
| 5,724,501 | A | * | 3/1998 | Dewey et al. ................... 714/9 |
| 5,724,542 | A | * | 3/1998 | Taroda et al. ............... 711/113 |
| 5,748,985 | A | * | 5/1998 | Kanai .......................... 711/130 |
| 5,799,200 | A | * | 8/1998 | Brant et al. .................. 713/340 |
| 5,835,780 | A | * | 11/1998 | Osaki et al. .................. 713/300 |
| 5,884,093 | A | * | 3/1999 | Berenguel et al. .............. 710/1 |
| 6,141,731 | A | * | 10/2000 | Beardsley et al. ........... 711/136 |
| 6,223,266 | B1 | * | 4/2001 | Sartore ........................ 711/170 |
| 6,243,831 | B1 | * | 6/2001 | Mustafa et al. ................ 714/24 |
| 6,336,174 | B1 | * | 1/2002 | Li et al. ....................... 711/162 |
| 6,496,939 | B2 | * | 12/2002 | Portman et al. ............. 713/340 |

(Continued)

OTHER PUBLICATIONS

Patent Abstracts of Japan, vol. 008, No. 208, p-302, Sep. 21, 1984 & JP 59 099295 A (Nippon Denki KK), "Backup system of Main Storage Device", NEC Corp., May 24, 1984 *abstract*.

*Primary Examiner*—Scott T. Baderman
*Assistant Examiner*—Loan Truong
(74) *Attorney, Agent, or Firm*—Jenna L. Wilson; Dimock Stratton LLP

(57) ABSTRACT

A system and method for automatically saving the contents of volatile memory in a data processing device on power failure. A secondary power supply is provided, which upon failure of the primary power supply supplies power long enough for all modified information stored in volatile memory to be written to a non-volatile memory device such as NAND flash in an AutoSave procedure. In the preferred embodiment modified sectors in volatile memory are flagged, and only modified sectors with a directory list are written to non-volatile memory during the AutoSave procedure.

18 Claims, 15 Drawing Sheets

U.S. PATENT DOCUMENTS

| | | | |
|---|---|---|---|
| 6,629,248 B1 * | 9/2003 | Stachura et al. | 713/340 |
| 6,691,137 B1 * | 2/2004 | Kishi | 707/203 |
| 6,993,680 B2 * | 1/2006 | Fukumori | 714/14 |
| 7,003,620 B2 * | 2/2006 | Avraham et al. | 711/103 |
| 7,100,080 B2 * | 8/2006 | Howe | 714/24 |
| 7,178,061 B2 * | 2/2007 | Aasheim et al. | 714/24 |
| 7,231,547 B2 * | 6/2007 | Moiroux et al. | 714/24 |
| 2002/0078399 A1 * | 6/2002 | Caulkins | 714/24 |
| 2003/0084252 A1 * | 5/2003 | Talagala | 711/135 |
| 2003/0095463 A1 | 5/2003 | Shimada et al. | |
| 2003/0097493 A1 * | 5/2003 | Weast | 710/5 |
| 2003/0110343 A1 * | 6/2003 | Hagiwara et al. | 711/5 |
| 2004/0078623 A1 * | 4/2004 | Totolos, Jr. | 714/4 |
| 2004/0078666 A1 * | 4/2004 | Aasheim et al. | 714/24 |
| 2004/0083405 A1 * | 4/2004 | Chang et al. | 714/24 |
| 2004/0168018 A1 * | 8/2004 | Aasheim et al. | 711/103 |
| 2005/0081072 A1 * | 4/2005 | Lee | 713/320 |
| 2005/0193288 A1 * | 9/2005 | Joshi et al. | 714/52 |
| 2005/0210323 A1 * | 9/2005 | Batchelor et al. | 714/14 |

* cited by examiner

Control Register

CCM_CONTROL  Reset State: 0x0000
Read/Write  Access: 16 bit

| 15 | 14 | 13 | 12 | 11 | 10 | 9 | 8 |
|----|----|----|----|----|----|---|---|
|    |    |    |    |    |    |   | RESET_DIR_FIFO |

| 7 | 6 | 5 | 4 | 3 | 2 | 1 | 0 |
|---|---|---|---|---|---|---|---|
| TAG_SRAM_CLEAR |  | AUTOSAVE_DOUBLE | NO_MISS_INTR | CACHE_ENABLE | SETS[2:0] | | |

| Bit # | Bit Mnemonic | Function |
|-------|--------------|----------|
| 15:9 | NA | (RO) '0000 000' |
| 8 | RESET_DIR_FIFO | Reset Dir FIFO<br>Write '1' – Resets Directory FIFO pointers<br>Write '0' – No operation<br>Read returns '0' – no valid value |
| 7 | TAG_SRAM_CLEAR | Tag SRAM Clear<br>Write this bit '1' to Clear all 65,536 Tag entries<br>On completing the Tag clear, this bit will read '0' |
| 6 | NA | (RO) '0' |
| 5 | AUTOSAVE_DOUBLE | AutoSave Double<br>'0' – Each of the AutoSave Block registers point to single erased blocks<br>'1' – Each of the AutoSave Block registers point to a group of 2 erased blocks in NAND Flash |
| 4 | NO_MISS_INTR | No Miss Interrupt<br>'0' – read and write misses generate an interrupt. The read must be reexecuted once the cache has been filled.<br>'1' – read and write misses are masked and the read or write cycle is extended to complete the transaction. |
| 3 | CACHE_ENABLE | Cached Enable<br>'0' – Cache Disabled<br>'1' – Cache Enabled (Tag controls sector mapping and modified tracking) |
| 2:0 | SETS[2:0] | Number of Sets used<br>Range is 1 – 7 for 256 Mb NAND and larger<br>Range is 1 – 8 for 128 Mb NAND Flash ("000" represents 8) |

FIG. 4

AutoSave Block 0 Pointer Register

CCM_ASV_BLOCK0_ADDR  Reset State:  0x0000

Read/Write  Access:  16 bit

| 15 | 14 | 13 | 12 | 11 | 10 | 9 | 8 |
|----|----|----|----|----|----|----|----|
|  |  |  |  | ASV_BLOCK0_ADDR[25:22] | | | |

| 7 | 6 | 5 | 4 | 3 | 2 | 1 | 0 |
|---|---|---|---|---|---|---|---|
| ASV_BLOCK0_ADDR[21:14] | | | | | | | |

| Bit# | Bit Mnemonic | Function |
|------|--------------|----------|
| 15:12 | NA | (RO) '0000' |
| 11:0 | ASV_BLOCK0_ADDR[25:14] | Address bits 25 to 14 pointing to the start of a NAND Flash erased block or a group of two NAND Flash erased blocks |

FIG. 5

AutoSave Block 1 Pointer Register

CCM_ASV_BLOCK1_ADDR  Reset State:  0x0000

Read/Write  Access:  16 bit

| 15 | 14 | 13 | 12 | 11 | 10 | 9 | 8 |
|----|----|----|----|----|----|----|----|
|  |  |  |  | ASV_BLOCK1_ADDR[25:22] | | | |

| 7 | 6 | 5 | 4 | 3 | 2 | 1 | 0 |
|---|---|---|---|---|---|---|---|
| ASV_BLOCK1_ADDR[21:14] | | | | | | | |

| Bit# | Bit Mnemonic | Function |
|------|--------------|----------|
| 15:12 | NA | (RO) '0000' |
| 11:0 | ASV_BLOCK1_ADDR[25:14] | Address bits 25 to 14 pointing to the start of a NAND Flash erased block or a group of two NAND Flash erased blocks |

FIG. 6

AutoSave Block 2 Pointer Register

CCM_ASV_BLOCK2_ADDR                                Reset State:   0x0000

Read/Write                                         Access:        16 bit

| 15 | 14 | 13 | 12 | 11 | 10 | 9 | 8 |
|----|----|----|----|----|----|---|---|
|    |    |    |    | ASV_BLOCK2_ADDR[25:22] | | | |

| 7 | 6 | 5 | 4 | 3 | 2 | 1 | 0 |
|---|---|---|---|---|---|---|---|
| ASV_BLOCK2_ADDR[21:14] | | | | | | | |

| Bit# | Bit Mnemonic | Function |
|------|--------------|----------|
| 15:12 | NA | (RO) '0000' |
| 11:0 | ASV_BLOCK2_ADDR[25:14] | Address bits 25 to 14 pointing to the start of a NAND Flash erased block or a group of two NAND Flash erased blocks |

FIG. 7

AutoSave Block 3 Pointer Register

CCM_ASV_BLOCK3_ADDR                                Reset State:   0x0000

Read/Write                                         Access:        16 bit

| 15 | 14 | 13 | 12 | 11 | 10 | 9 | 8 |
|----|----|----|----|----|----|---|---|
|    |    |    |    | ASV_BLOCK3_ADDR[25:22] | | | |

| 7 | 6 | 5 | 4 | 3 | 2 | 1 | 0 |
|---|---|---|---|---|---|---|---|
| ASV_BLOCK3_ADDR[21:14] | | | | | | | |

| Bit# | Bit Mnemonic | Function |
|------|--------------|----------|
| 15:12 | NA | (RO) '0000' |
| 11:0 | ASV_BLOCK3_ADDR[25:14] | Address bits 25 to 14 pointing to the start of a NAND Flash erased block or a group of two NAND Flash erased blocks |

FIG. 8

SYSTEM AND METHOD FOR AUTOMATICALLY SAVING MEMORY CONTENTS OF A DATA PROCESSING DEVICE ON POWER FAILURE

BACKGROUND

Handheld data processing devices, sometimes known as "personal digital assistants", are becoming very popular tools for information storage and retrieval, messaging and other functions. Such devices have the ability to store a significant amount of data, including calendar, address book, tasks and numerous other types of data for business and personal use. Most handheld data processing devices have the ability to connect to a personal computer for data exchange, and many are equipped for wireless communications using, for example, conventional email messaging systems. One of the primary advantages of a handheld data processing device is its small size, and to maintain this the space inside the device must be used efficiently.

A typical handheld data processing device has a processor for processing the data, which accesses data from a non-volatile memory storage device that retains data even when no power is being supplied to the chip, such as a NOR flash chip. Typically the processor caches data read from non-volatile memory, such as NOR flash, to a volatile storage device, such as SRAM, that retains data only when power is being supplied to the chip (i.e. when the handheld data processing device is on). Accordingly, the processor in conventional handheld data processing devices is designed and programmed to read data from NOR flash and write the data to SRAM for use or modification; and to read data from SRAM and write modified data to NOR flash for long term storage.

Another type of non-volatile memory, known as NAND flash, contains more memory density than a comparable NOR flash and is less expensive than NOR flash. However, whereas data is read out of and written to NOR flash memory one byte or word at a time, data must be read out of and written to NAND flash memory in blocks or "sectors" of data. For example, reading a 16-bit data value stored in NOR flash requires one read access to the flash device, whereas to read the same 16-bit value from NAND flash requires reading out an entire 512 byte sector.

In a digital processing system that caches the contents from a NAND flash in SDRAM on a sector by sector basis, it is possible for any portion of the cached data in the SDRAM to be modified by software at any time. The NAND flash can be updated with this modified data at a later point in time when it is convenient for software. Unfortunately, when the power source is disconnected (for example in the case of a handheld digital processing device, the battery is removed), there is not enough time for software to update the NAND flash with the modified data from SDRAM before power is lost completely. However, due to space constraints it is not feasible to provide a long lasting secondary power supply in a handheld data processing device.

It would accordingly be advantageous to provide a system and method which ensures that no data will be lost due to a power failure, that can write data to the non-volatile memory during a short backup power interval so that the secondary power supply does not require excessive space.

SUMMARY OF THE INVENTION

The invention provides a system and method for automatically saving the contents of volatile memory in a data processing device on power failure. A small secondary power supply is provided, which upon failure of the primary power supply supplies power for long enough that all modified data stored in volatile memory can be written to a non-volatile memory device such as NAND flash during an AutoSave procedure.

Detecting the power failure and performing an automatic data saving routine (AutoSave) in hardware allows the data to be preserved in the non-volatile memory device in an effective and power-efficient manner, reducing the size of the required secondary power supply and thus the space needed for the secondary power supply.

The present invention thus provides a method of automatically saving data upon interruption of power from a primary power supply in a data processing device having a non-volatile memory device for storing data and retaining the stored data when the primary power supply is deactivated and a volatile memory device for caching data from the non-volatile memory device for reading or processing by a processor when the primary power supply is activated, comprising the steps of: designating modified sectors of data stored in the volatile memory device as modified and storing a modified sector directory list, detecting a power interruption in the primary power supply, enabling a secondary power supply, and writing data from the volatile memory device and the modified sector directory list to the non-volatile memory device while the secondary power supply is enabled.

The present invention further provides in a data processing device having a primary power supply, a non-volatile memory device for storing data and retaining the stored data when the primary power supply is deactivated, and a volatile memory device for storing data from the non-volatile memory device for reading or processing by a processor when the primary power supply is activated, an automatic data saving system comprising a memory controller component for controlling a flow of data between the non-volatile memory device and the volatile memory device and storing a modified sector directory list, a tracking component for designating sectors of modified data stored in the volatile memory device as modified, a detection component for detecting a power interruption in the primary power supply, and a secondary power supply enabled upon detection of a power interruption in the primary power supply, providing electrical power sufficient to allow for modified data sectors in the volatile memory device to be written to the non-volatile memory device.

In further aspects of the system and method of the invention, only modified data and the modified data directory list is written from the volatile memory device to the non-volatile memory device. In preferred embodiments, when a predetermined limit of modified data that can be written to the non-volatile memory device during the AutoSave interval has been reached or exceeded during normal operation of the device, data is written from the volatile memory device to the non-volatile memory device to reduce the number of modified data sectors to below the limit. Also, the preferred embodiments provide at least one sector address register pointing to at least one erased block in non-volatile memory for writing data, and preferably the sector address register can be configured to point to one erased block or to a group of erased blocks.

BRIEF DESCRIPTION OF THE DRAWINGS

In drawings which illustrate an embodiment of the invention by way of example only.

FIG. 4 is a table illustrating the Cache Controller Module control register.

FIGS. 5 to 8 are tables respectively illustrating the Cache Controller Module AutoSave block address registers for the four blocks reserved in memory for data written during the AutoSave procedure.

DETAILED DESCRIPTION

Figure 1:
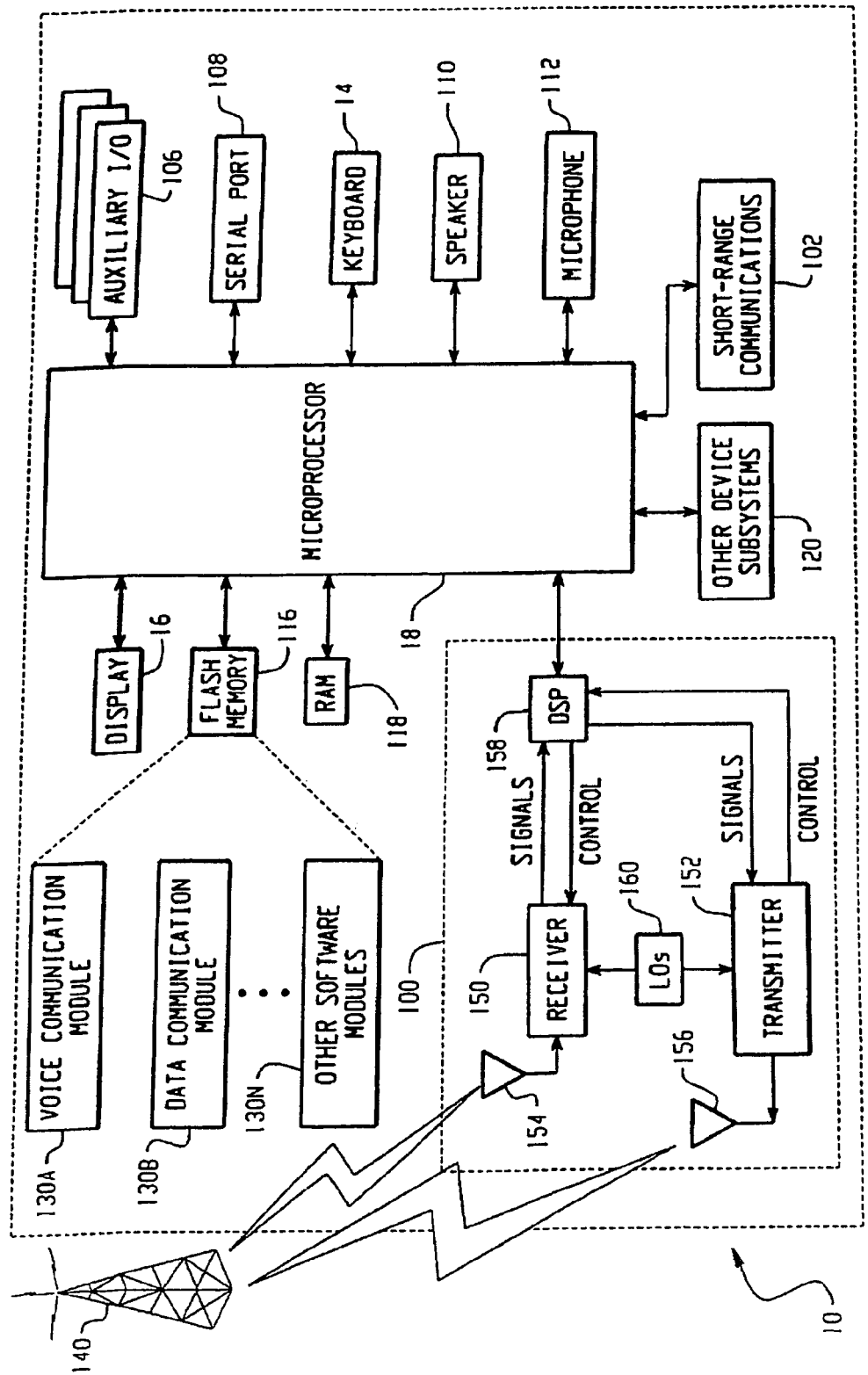
FIG. 1 is a block diagram of a system overview of a conventional hand-held data processing device.
Figure 2:
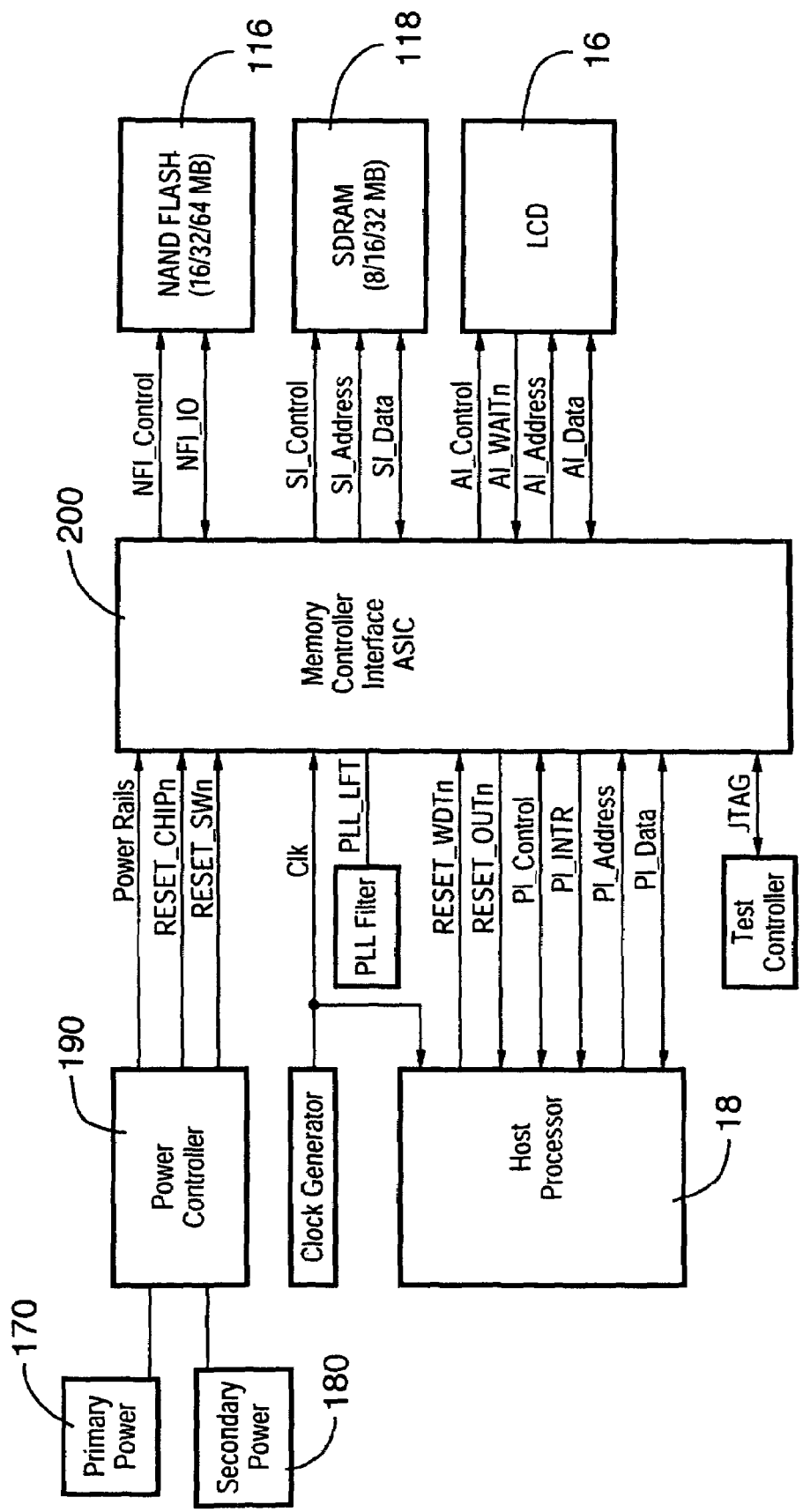
FIG. 2 is a system interface block diagram of a data processing device.
Figure 3A:
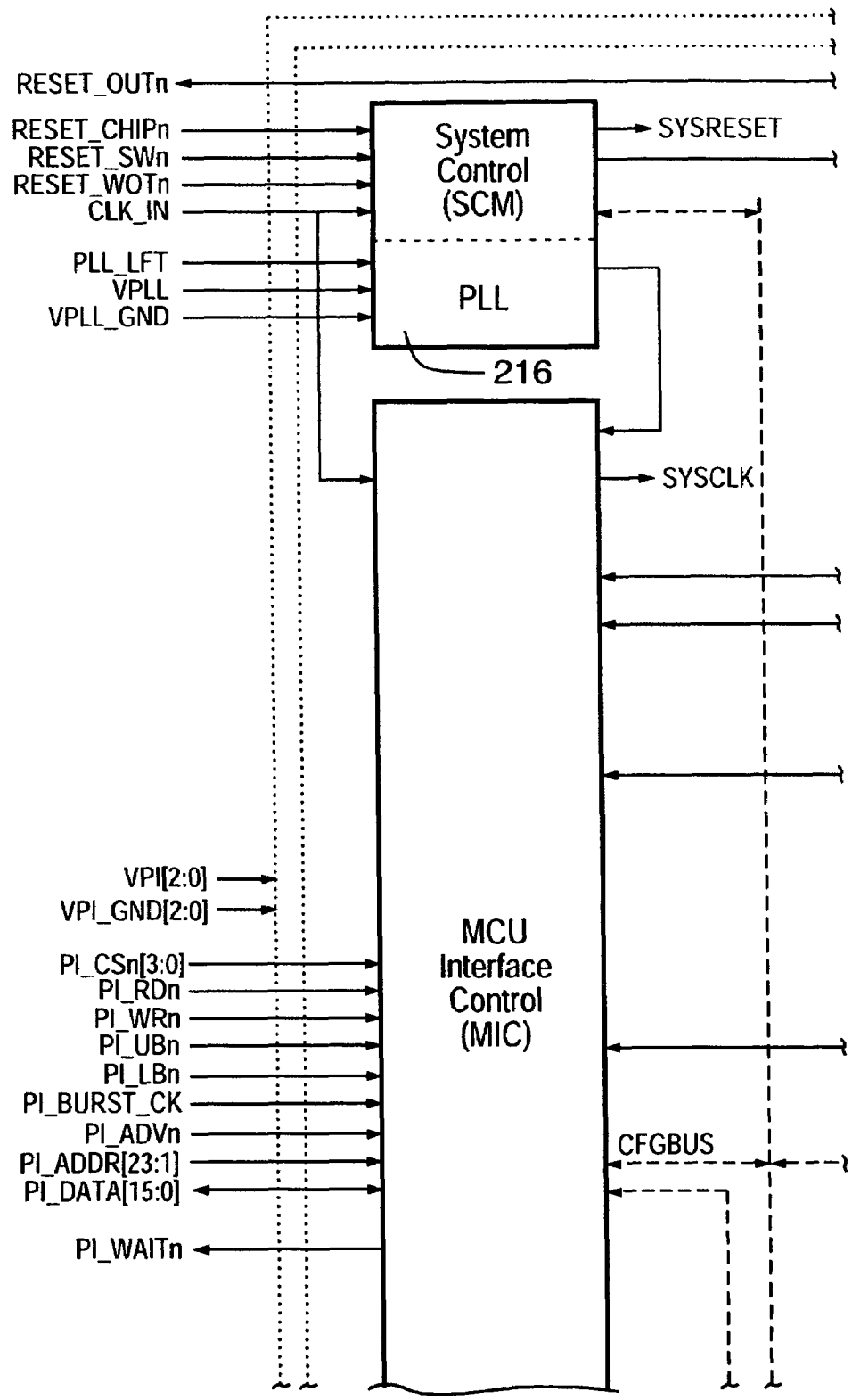
FIGS. 3A to 3H are component parts assembled as shown in FIG. 3I to form a detailed block diagram of the memory controller interface in the data processing device of FIG. 2.
Figure 3B:
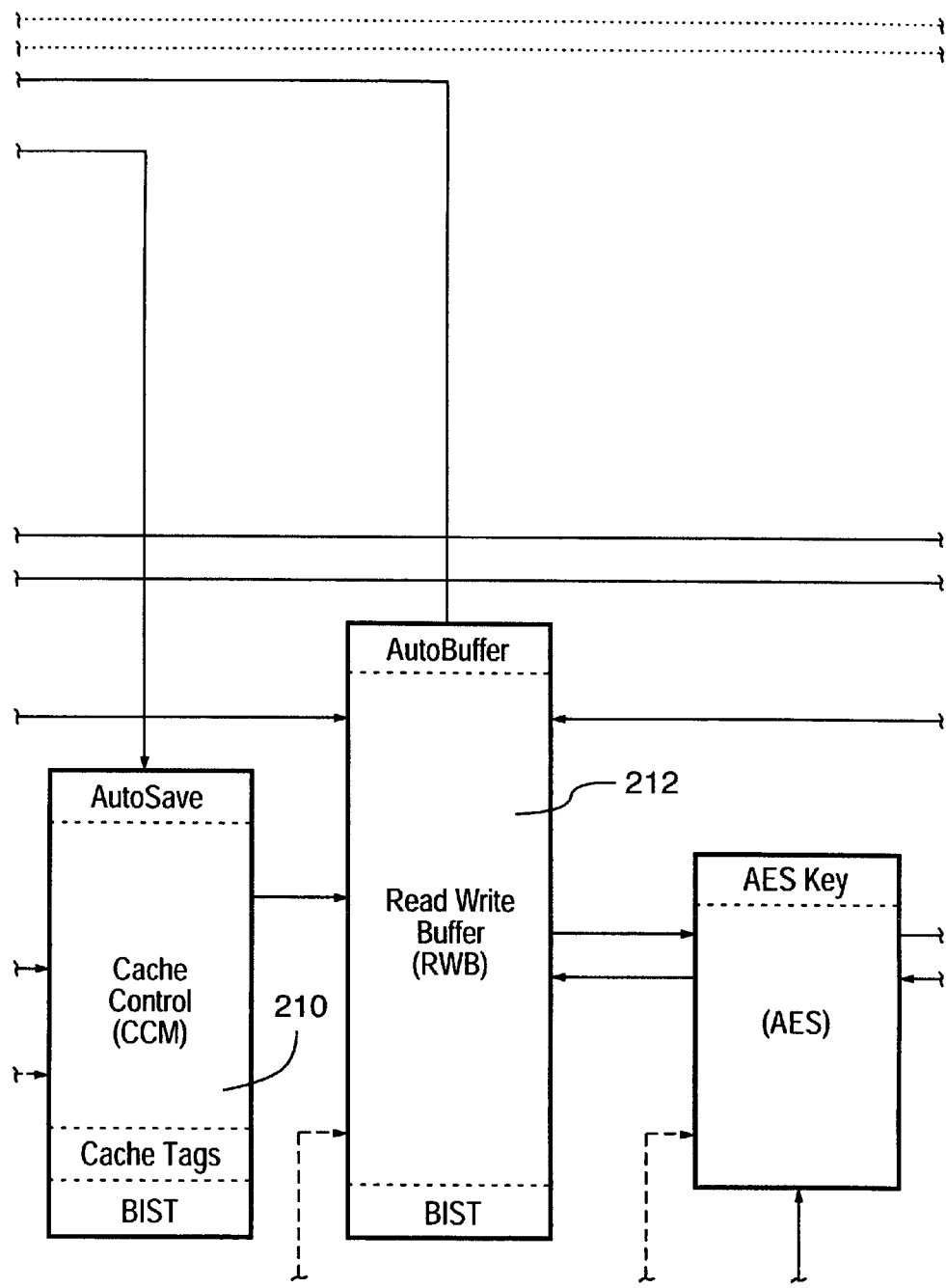
Figure 3C:
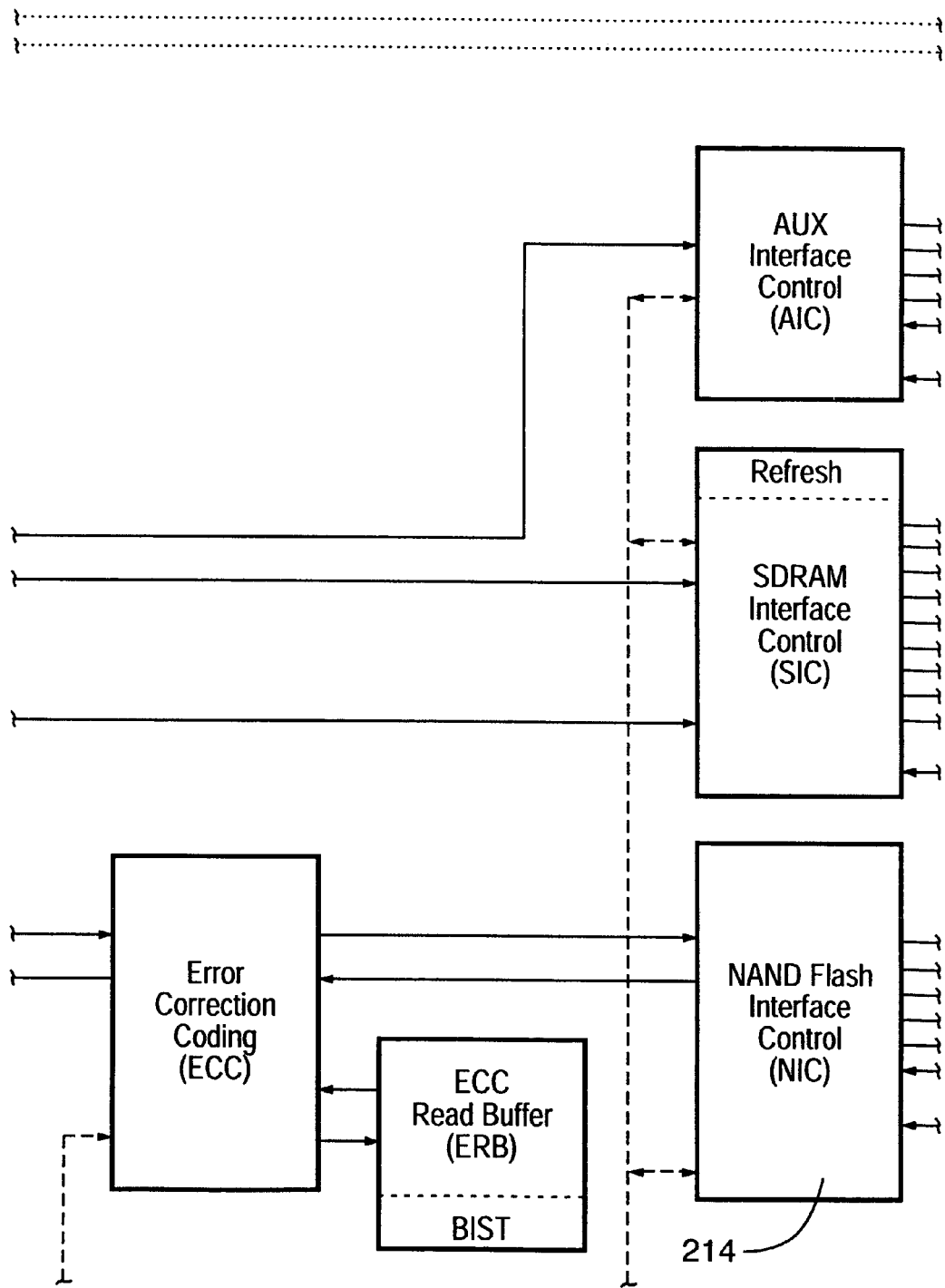
Figure 3D:
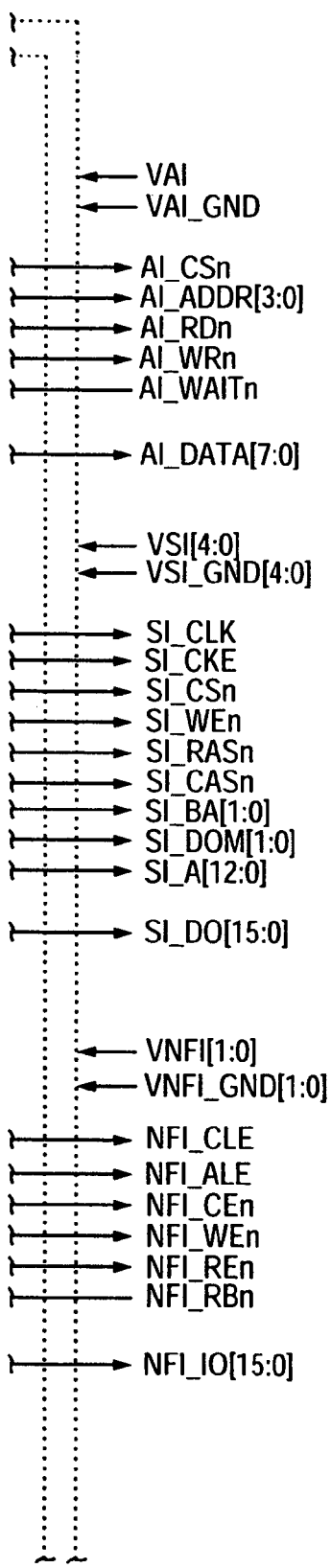
Figure 3E:
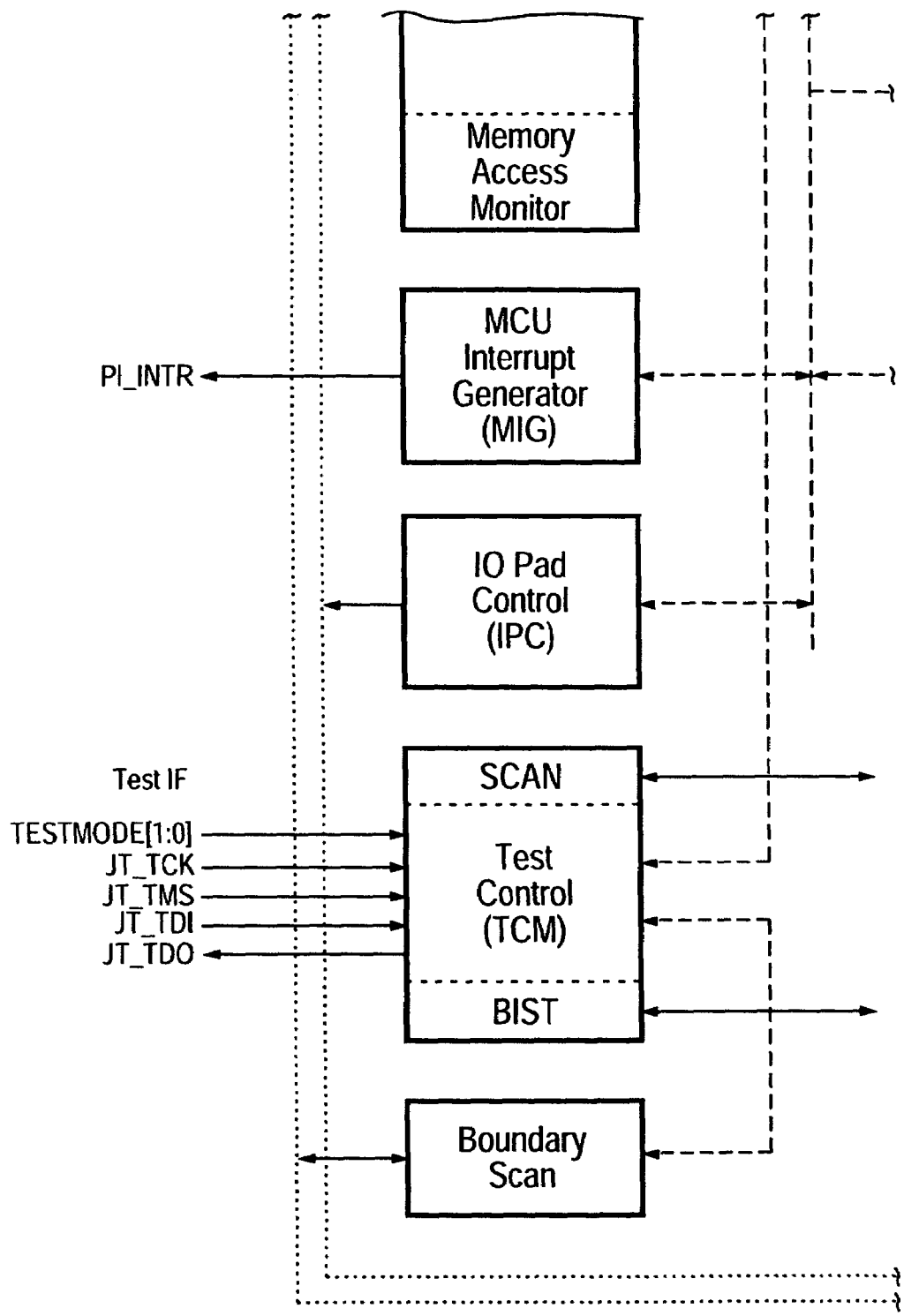
Figure 3F:
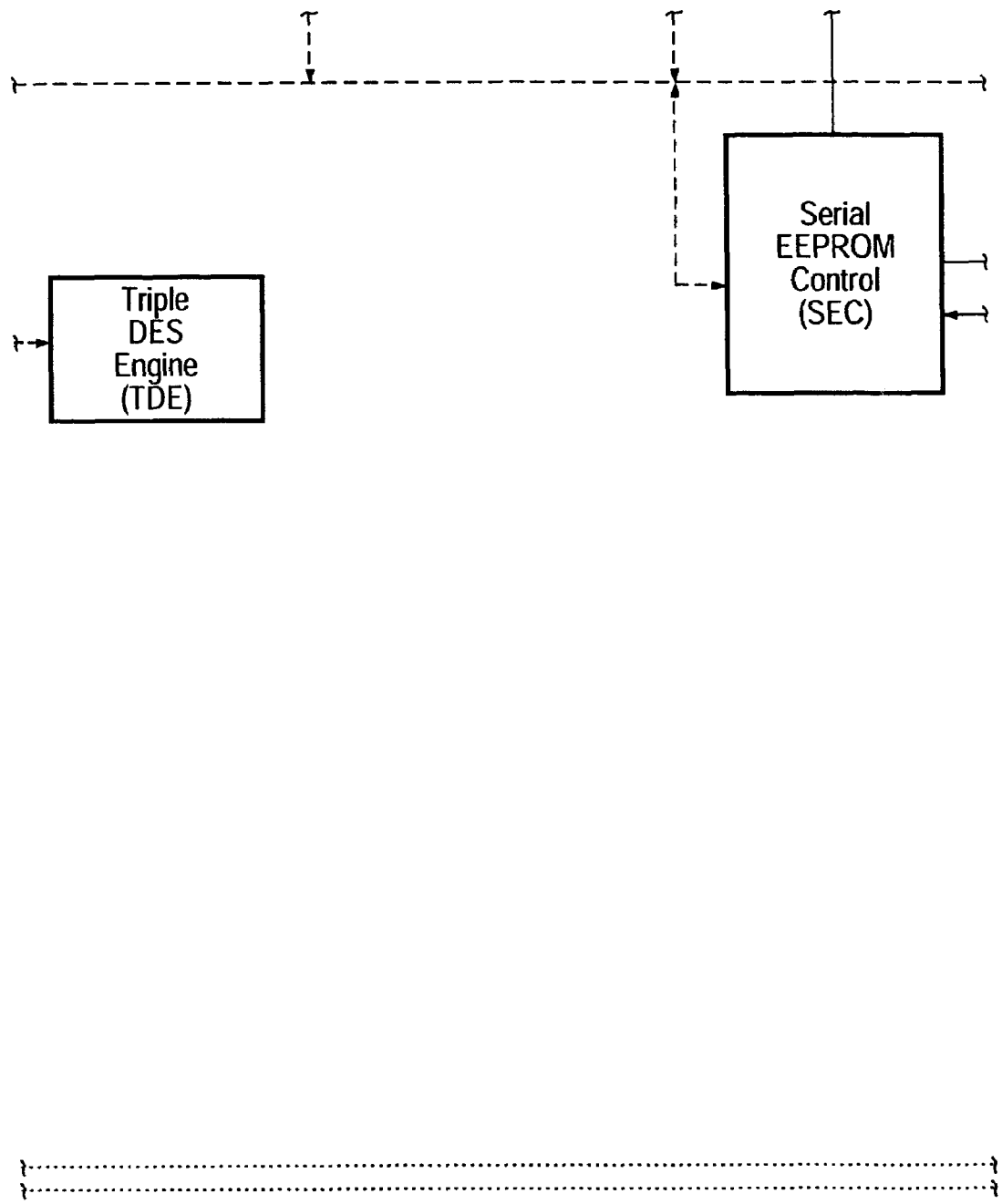
Figure 3G:
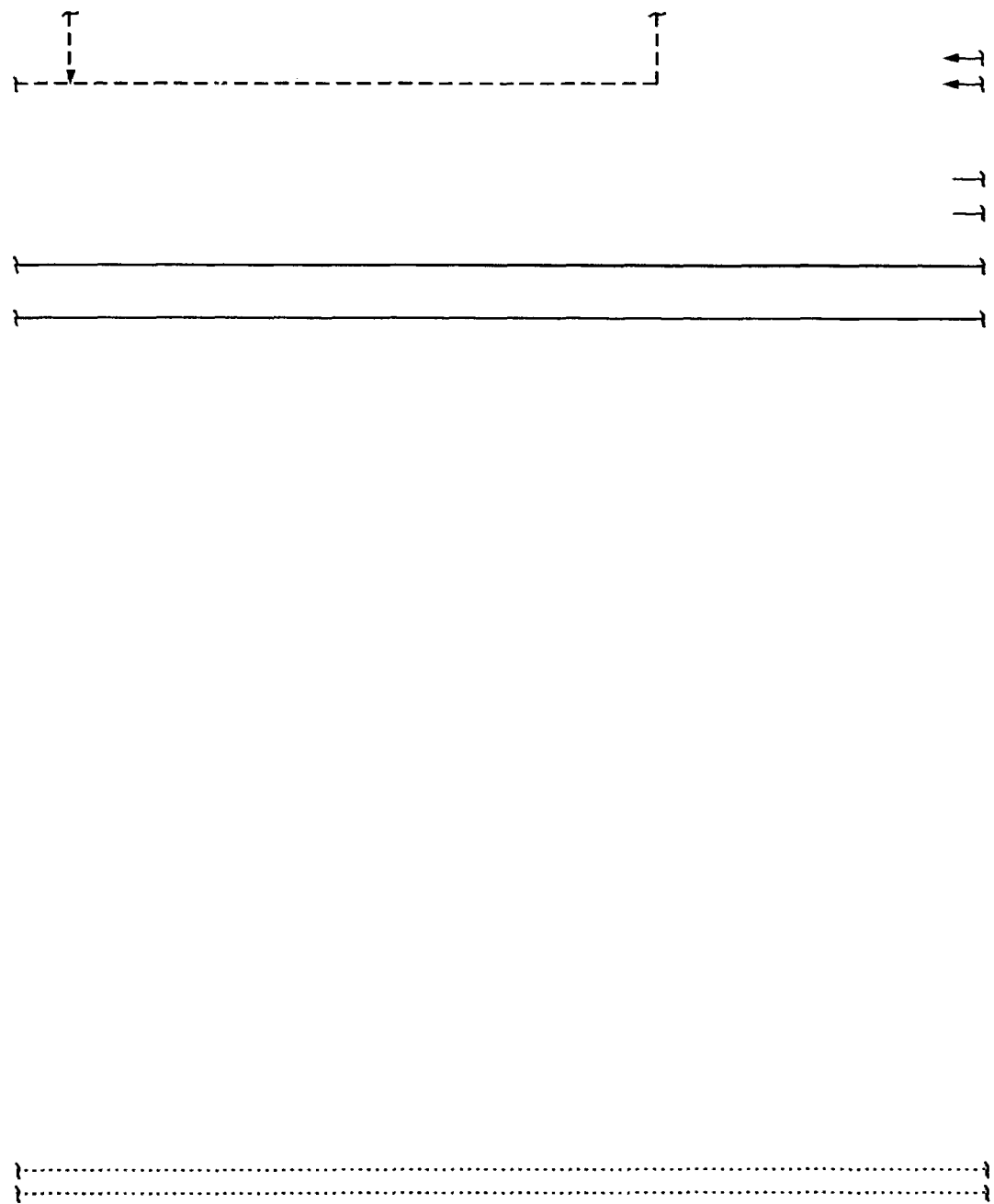
Figure 3H:
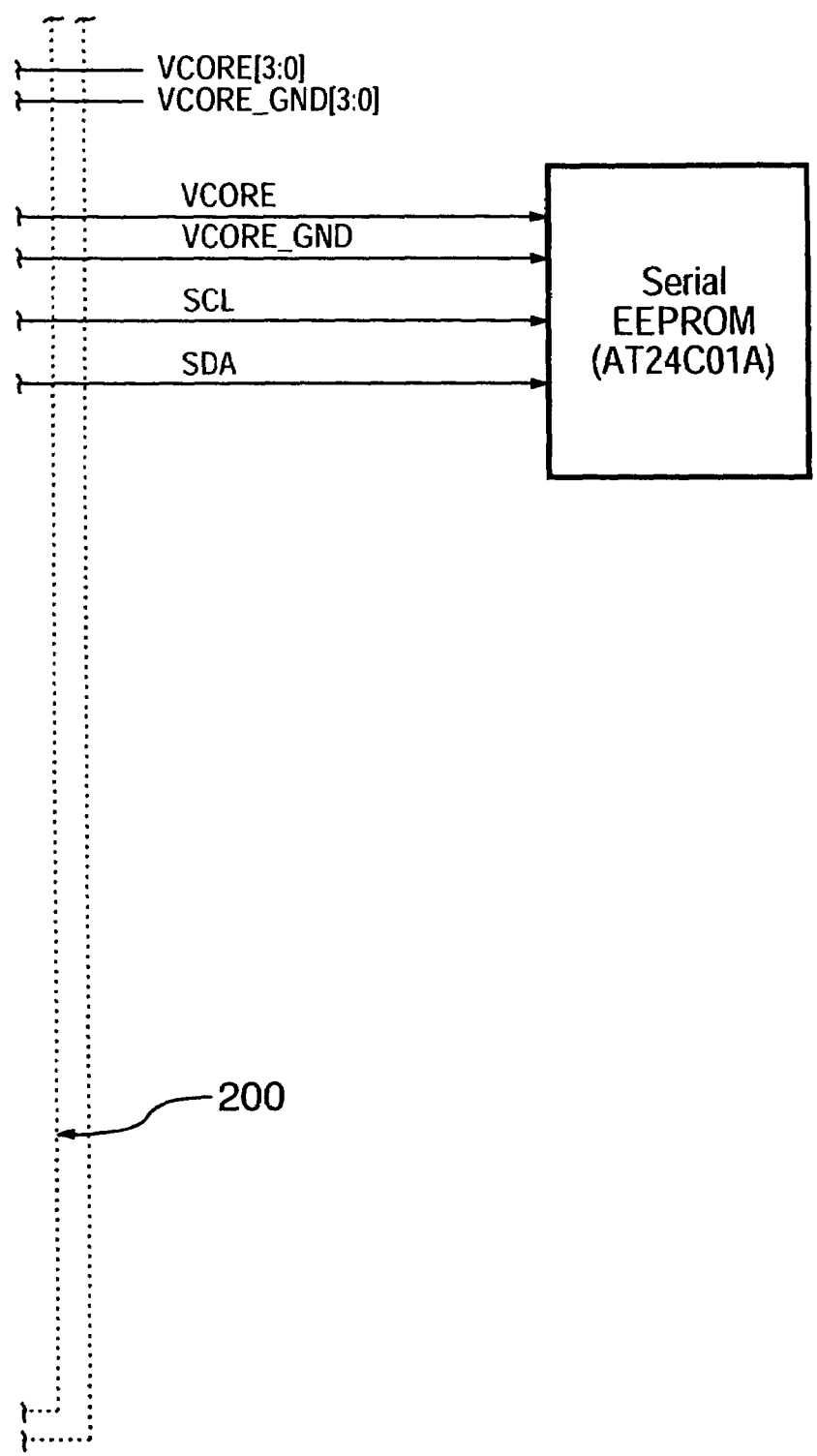
Figure 3I:
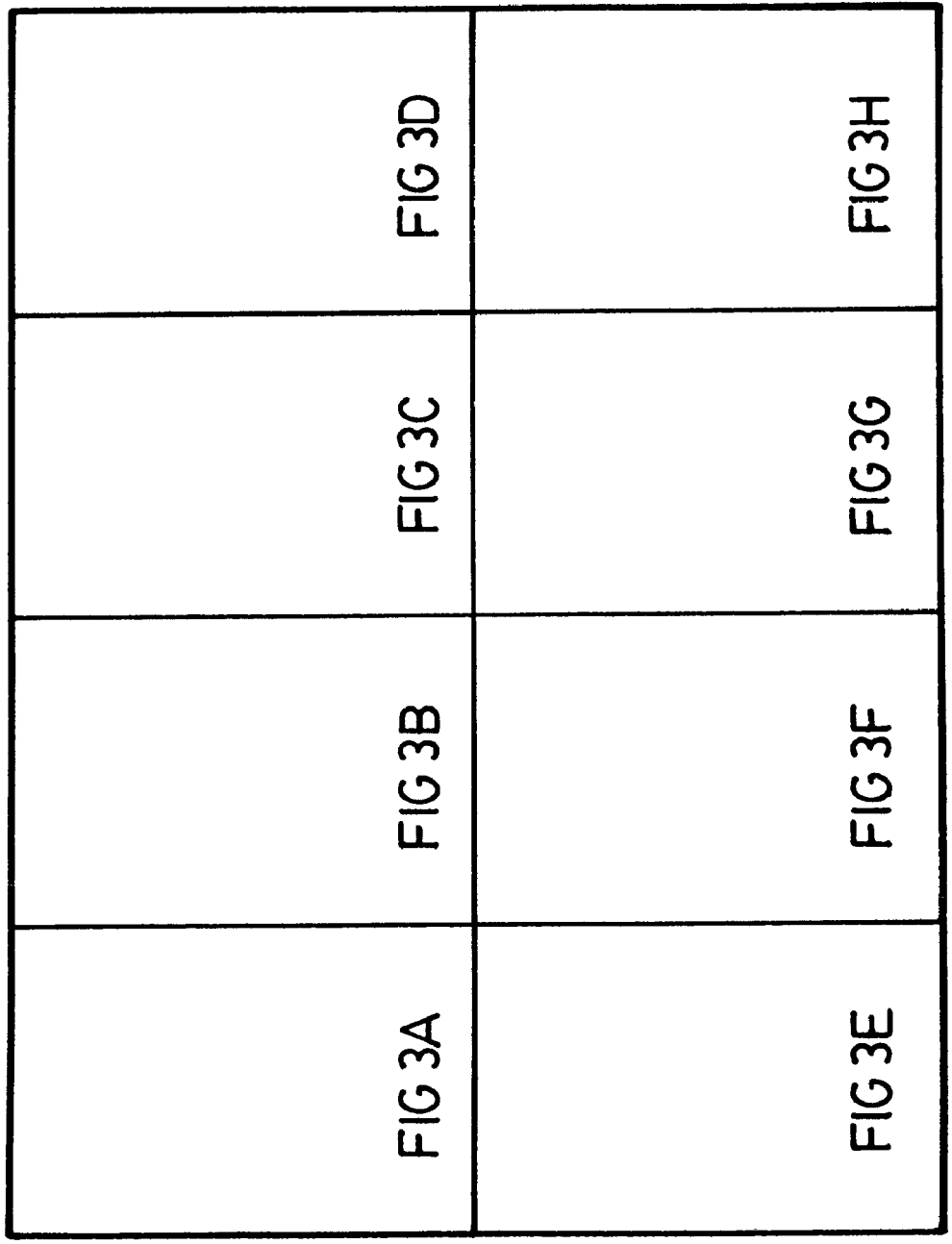
Figure 9:
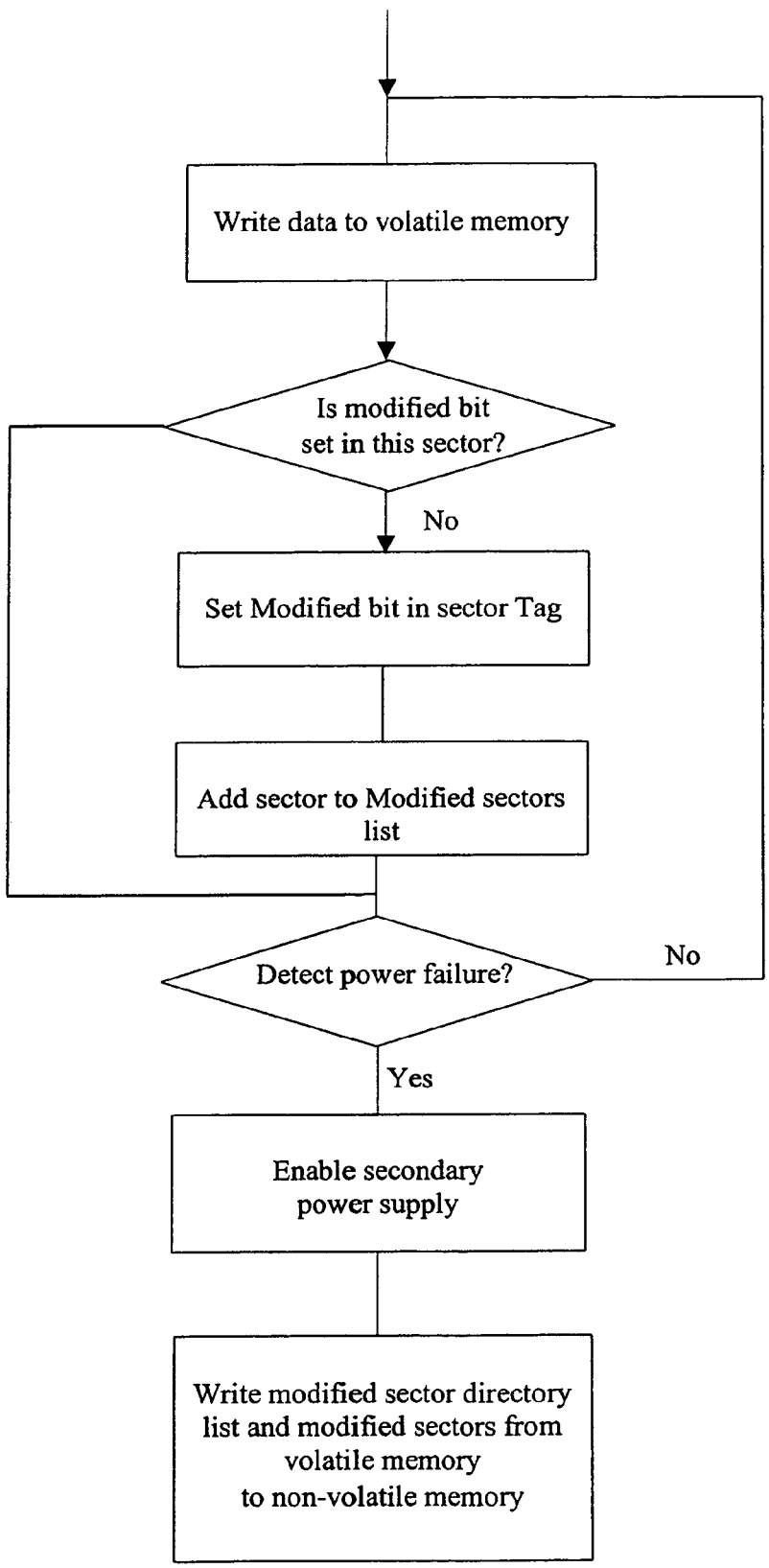
FIG. 9 is a flow chart illustrating the method of the invention.

The invention will be described in detail below, by way of example only, in the context of a hand-held data processing device having wireless communications capabilities and a battery, as illustrated in FIG. 1, and a memory controller interface that caches sectors out of NAND flash into SDRAM for processing, and writes modified data from SDRAM back to NAND flash for more permanent storage, as illustrated in FIGS. 2 and 3. However, although the invention is particularly advantageous in the hand-held data processing device 10, it will be appreciated that the principles of the system apply to other data processing devices and the system is not intended to be limited thereby.

The hand-held data processing devices 10 include a housing, a keyboard 14 and an output device 16. The output device shown is a display 16, which is preferably a full graphic LCD. Other types of output devices may alternatively be utilized. A processor 18, which is shown schematically in FIG. 1, is contained within the housing and is coupled between the keyboard 14 and the display 16. The processor 18 controls the operation of the display 16, as well as the overall operation of the data processing device 10, in response to actuation of keys on the keyboard 14 by the user.

The housing may be elongated vertically, or may take on other sizes and shapes (including clamshell housing structures). The keyboard may include a mode selection key, or other hardware or software for switching between text entry and telephony entry. The housing contains the primary power supply, in the embodiment shown a battery 170, a secondary power supply 180 (illustrated in FIG. 2), which may be a small rechargeable battery or capacitor capable of sustaining power to the processor 18, NAND flash 116 and SDRAM 118 for the duration of an AutoSave interval and a Power Controller 190.

In addition to the processor 18, other parts of the data processing device 10 are shown schematically in FIG. 1. These include a communications subsystem 100; a short-range communications subsystem 102; the keyboard 14 and the display 16, along with other input/output devices 106, 108, 110 and 112; as well as memory devices 116, 118 and various other device subsystems 120. The data processing device 10 is preferably a two-way RF communication device having voice and data communication capabilities. In addition, the data processing device 10 preferably has the capability to communicate with other computer systems via the Internet.

Operating system software executed by the processor 18 is preferably stored in a persistent store, such as a flash memory 116, but may be stored in other types of memory devices, such as a read only memory (ROM) or similar storage element. In addition, system software, specific device applications, or parts thereof, may be temporarily loaded into a volatile store, such as a random access memory (RAM including also DRAM and SDRAM) 118. Communication signals received by the data processing device 10 may also be stored to the RAM 118.

The processor 18, in addition to its operating system functions, enables execution of software applications 130A-130N on the device 10. A predetermined set of applications that control basic device operations, such as data and voice communications 130A and 130B, may be installed on the device 10 during manufacture. In addition, a personal information manager (PIM) application may be installed during manufacture. The PIM is preferably capable of organizing and managing data items, such as e-mail, calendar events, voice mails, appointments, and task items. The PIM application is also preferably capable of sending and receiving data items via a wireless network 140. Preferably, the PIM data items are seamlessly integrated, synchronized and updated via the wireless network 140 with the device user's corresponding data items stored or associated with a host computer system.

Communication functions, including data and voice communications, are performed through the communication subsystem 100, and possibly through the short-range communications subsystem. The communication subsystem 100 includes a receiver 150, a transmitter 152, and one or more antennas 154 and 156. In addition, the communication subsystem 100 also includes a processing module, such as a digital signal processor (DSP) 158, and local oscillators (LOs) 160. The specific design and implementation of the communication subsystem 100 is dependent upon the communication network in which the data processing device 10 is intended to operate. For example, a data processing device 10 may include a communication subsystem 100 designed to operate with the Mobitex™, Data TAC™ or General Packet Radio Service (GPRS) mobile data communication networks and also designed to operate with any of a variety of voice communication networks, such as AMPS, TDMA, CDMA, PCS, GSM, etc. Other types of data and voice networks, both separate and integrated, may also be utilized with the data processing device 10.

Network access requirements vary depending upon the type of communication system. For example, in the Mobitex and DataTAC networks, mobile devices are registered on the network using a unique personal identification number or PIN associated with each device. In GPRS networks, however, network access is associated with a subscriber or user of a device. A GPRS device therefore requires a subscriber identity module, commonly referred to as a SIM card, in order to operate on a GPRS network.

When required network registration or activation procedures have been completed, the data processing device 10 may send and receive communication signals over the communication network 140. Signals received from the communication network 140 by the antenna 154 are routed to the receiver 150, which provides for signal amplification, frequency down conversion, filtering, channel selection, etc., and may also provide analog to digital conversion. Analog-to-digital conversion of the received signal allows the DSP 158 to perform more complex communication functions, such as demodulation and decoding. In a similar manner, signals to be transmitted to the network 140 are processed (e.g. modulated and encoded) by the DSP 158 and are then provided to the transmitter 152 for digital to analog conversion, frequency up conversion, filtering, amplification and transmission to the communication network 140 (or networks) via the antenna 156.

In addition to processing communication signals, the DSP 158 provides for control of the receiver 150 and the transmitter 152. For example, gains applied to communication signals in the receiver 150 and transmitter 152 may be adaptively controlled through automatic gain control algorithms implemented in the DSP 158.

In a data communication mode, a received signal, such as a text message or web page download, is processed by the communication subsystem 100 and is input to the processor 18. The received signal is then further processed by the processor 18 for an output to the display 16, or alternatively to some other auxiliary I/O device 106. A device user may also compose data items, such as e-mail messages, using the keyboard 14 and/or some other auxiliary I/O device 106, such as a touchpad, a rocker switch, a thumb-wheel, or some other type of input device. The composed data items may then be transmitted over the communication network 140 via the communication subsystem 100.

In a voice communication mode, overall operation of the device is substantially similar to the data communication mode, except that received signals are output to a speaker 110, and signals for transmission are generated by a microphone 112. Alternative voice or audio I/O subsystems, such as a voice message recording subsystem, may also be implemented on the device 10. In addition, the display 16 may also be utilized in voice communication mode, for example to display the identity of a calling party, the duration of a voice call, or other voice call related information.

The short-range communications subsystem enables communication between the data processing device 10 and other proximate systems or devices, which need not necessarily be similar devices. For example, the short-range communications subsystem may include an infrared device and associated circuits and components, or a Bluetooth™ communication module to provide for communication with similarly-enabled systems and devices.

In the preferred embodiment illustrated in FIG. 2, which is a system interface block diagram of a data processing device, the memory controller interface 200 provides the necessary functions for error control, security, caching, and DRAM refresh, and enables the processor 18 to communicate with NAND Flash and SDRAM memory devices 116, 118 by caching sectors out of NAND flash 116 into SDRAM 118. It will be appreciated by those skilled in the art that these functions may alternatively be performed by separate components interlinked by suitable interfaces.

During normal operation of the data processing device 10, sectors containing data required by the processor 18 are read out of NAND flash 116 and written into SDRAM 118, where the data can be randomly accessed by the processor 18. The processor 18 can use its existing asynchronous or burst memory interface to access the memory controller interface 200, which in turn controls the NAND flash 116 and SDRAM 118. The software running on the processor 18 can access the SDRAM 118 directly or use read/write buffers inside the memory controller interface 200 to transfer sectors of data between NAND flash 116 and SDRAM 118.

Sectors are tracked as they are written to SDRAM 118, and in the preferred embodiment sectors cached in SDRAM 118 are flagged as either modified or unmodified. During normal operation of the data processing device 10 modified sectors are written back to NAND flash 116 when it is convenient for the processor 18 to do so. If SDRAM 118 is full, and the processor 18 requests a sector from NAND flash 116, the memory controller interface 200 erases any unmodified sector in SDRAM 118 and overwrites it with the new data from NAND flash 116. If all sectors in SDRAM 118 have been modified, the memory controller interface 200 reads one or more sectors out of SDRAM 118 and moves it into temporary storage buffers before retrieving the newly requested data from NAND flash 116 and writing it into SDRAM 118.

Preferably, when the processor 18 issues a data request the memory controller 200 first checks the internal cache Tag SRAM to determine whether the data sector is already cached in SDRAM 118, and if so reads the data directly from SDRAM 118. Only if the data is not already cached in SDRAM 118 does the memory controller interface 200 execute the read from NAND/write to SDRAM operation. In this fashion only uncached sectors need to be copied to SDRAM 118, reducing the burden on the memory system. Write operations are also cached in SDRAM 118, modifying the sector stored in SDRAM 118 (originally read from NAND flash 116), but are not written back to NAND flash 116 until either it is convenient for the processor 18 or all of the sectors stored in SDRAM 118 have been modified and one or more needs to be written to NAND flash 116 to make room in SDRAM 118 for new data. During normal operation of the device 10 the NAND Flash interface controller (NIC) 214 (illustrated in FIG. 3), which generates the protocol necessary to access raw NAND flash memory 116, supplies the sector address for all save operations; the AutoSave procedure, on the other hand, uses erased block pointers in the cache controller (CCM) 210 through the AutoBuffer (which during normal operation of the device 10 manages the write buffers and selects an empty write buffer for transfers from SDRAM 118 to the NAND flash 116) to supply the sector addresses to the NIC 214 for the save operations.

Thus, at any particular point in time during use of the data processing device 10 there may be a significant amount of modified data stored in SDRAM 118 which is awaiting a convenient time to be written to the NAND flash memory device 116. To avoid loss of the modified data if power is suddenly removed from the device 10, the invention provides a system and method for automatically saving the data upon failure of the primary power supply 170.

In the preferred embodiment a secondary power supply 180 is provided, which is activated by power controller 190 immediately upon interruption of power from the primary power supply 170 and supplies backup power to the memory controller 200, NAND flash 116 and SDRAM 118 for an interval that is long enough for all modified information stored in SDRAM 118 to be written to NAND flash 116 in an automatic data saving ("AutoSave") procedure. It will be appreciated that an interruption of power from the primary power supply 170 may occur even in the absence of a total loss of power, and the power controller 190 can be set to detect any drop in power from the primary power supply 170 that might jeopardize the contents of the volatile memory 118. As described below, the AutoSave function has 4 pointers to erased blocks that will be written on power fail, each of the AutoSave address registers pointing to a single erased NAND flash block or a group of two consecutive erased NAND flash blocks depending upon the status of the AutoSave Double bit. The pointer registers are illustrated in FIGS. 5 to 8. For typical applications a few tenths of a second is expected to be a sufficient AutoSave interval.

In the embodiment illustrated, two dedicated inputs to the memory controller interface 200 are provided to detect a power failure. A power failure is indicated when the RESET_CHIPn signal is asserted while RESET_SWn is unasserted. When a power failure is detected, several events occur. First, an external reset signal is asserted which holds the host processor 18 in reset mode, and the host interface inside the memory controller interface 200 is disabled (the reset internal to the memory controller interface 200 is not asserted at this time), to reduce power consumption and ensure that the processor 18 will not corrupt the SDRAM or NAND flash memories 118 with spurious writes. Second, depending on how a configuration bit is set, the clock internal to the memory controller interface 200 will use either an external clock source or an internal free running oscillator. This allows the external oscillator to be disabled to conserve power when the internal oscillator is selected and used during a power failure. Third, the Cache Controller Module (CCM) 210 inside the memory controller interface 200 writes the modified data stored in SDRAM 118 to the NAND flash 116 by generating requests to the AutoBuffer in Read-Write Buffer (RWB) 212, which manages the flow of data between the SDRAM 118 and NAND flash memory 116, to transfer up to 255 modified sectors to NAND flash 116 on power fail. The CCM 210 is also responsible for tracking which sectors have been modified during normal operation, to ensure no data is lost when the power fails. Only after the CCM 210 has saved all of the modified data into the NAND flash 116 is the memory controller interface 200 internal reset asserted.

Preferably some of the AutoSave parameters are configurable, including:

Register Item
SCM_CCR: AUTOSAVE_PF
SCM_CCR: AUTOSAVE_WD
CCM_ASV_BLOCK0_ADDR: ASV_BLOCK0_ADDR
CCM_ASV_BLOCK1_ADDR: ASV_BLOCK1_ADDR
CCM_ASV_BLOCK2_ADDR: ASV_BLOCK2_ADDR
CCM_ASV_BLOCK3_ADDR: ASV_BLOCK3_ADDR
CCM_CONTROL: AUTOSAVE_DOUBLE For large NAND Flash chips, the cache tag entries each refer to 2 sectors so the bit 5 of the CCM 210 control register provides an AUTOSAVE_DOUBLE option, as shown in FIG. 4, which configures the characteristics of AutoSave data transfers. When bit 5 is low the Autosave Block Registers each point to a single erased block in NAND flash 116. When bit 5 is high the Autosave Block Registers each point to a group of 2 erased blocks in NAND flash 116. AUTOSAVE_PF is used to enable/disable the AUTOSAVE of modified sectors in SDRAM to NAND Flash on a loss of the primary power. AUTOSAVE_WD is used to enable/disable the AUTOSAVE of modified sectors in SDRAM to NAND Flash on the occurrence of a WatchDog interrupt.

In operation, when the AutoSave routine is invoked by assertion of the RESET_CHIPn signal with RESET_SWn unasserted, the RESET_OUTn signal is asserted by the System Control Module (SCM) 216 and the Directory FIFO in the CCM 210 indicates the sectors that have been flagged as modified and need to be saved into the NAND flash 116 at the locations identified by the AutoSave block addresses.

First the Directory FIFO is written in NAND flash 116 at the first sector pointed to by AUTOSAVE_BLOCK0_ADDR. Then, the tag entries associated with every sector address contained in the Directory FIFO are checked. If a valid tag is found, then the sector in cache associated with the tag is written into NAND flash 116. If an invalid tag is found indicating that the sector was in the process of being replaced, then a search and compare of the registers in the Read-Write Buffer 212 is done to determine which of the write buffer contains the modified sector in transit that is to be written into NAND flash 116. When all modified sectors are written into NAND flash 116, the CCM 210 will signal the SCM 216 by asserting the "update_done" signal and this will reset the memory controller.

The AUTOSAVE_BLOCK0_ADDR, AUTOSAVE_BLOCK1_ADDR, AUTOSAVE_BLOCK2_ADDR and AUTOSAVE_BLOCK3_ADDR registers, illustrated in FIGS. 5 to 8, indicate the pre-erased write areas in the NAND Flash to which unsaved modified data is to be stored during AutoSave. These addresses point to either 128 or 256 contiguous sectors, as determined by the AUTOSAVE_DOUBLE configuration bit. The first sector always contains the Directory list which consists of up to 255 entries of 2 bytes indicating the sector numbers of NAND Flash from which the modified sectors that follow originated (any unused entries in this sector will contain 0x0000—this sector address is never modified since it is part of the boot block). A maximum of 127 or 255 sectors that follow contain modified NAND Flash sectors referenced in the Directory list (when the Directory list is exhausted, this ends the AutoSave write area). For 512 Mb NAND Flash, each Tag entry represents 2 sectors and require 2 requests to the AutoBuffer for each Tag entry—only 127 Modified Tag entries can be saved in the allotted 8 NAND Flash blocks.

On the completion of the AutoSave routine, the memory control interface 200 is enabled to accept a power-up reset. The Directory list in the first sector provides the sector numbers for the modified sectors that follow and allow the data prior to the power failure to be re-constructed when power returns.

The number of sectors that can be saved during AutoSave is determined by the Directory FIFO. There are only 256 entries, and as a result the maximum number of modified sectors is 256. If at any time, the number of modified sectors exceed this number, then the Directory FIFO write pointer will wrap, and the Directory FIFO will become corrupted. To avoid lost of information in a software controlled cache system, software should unload the Directory FIFO information prior to an overflow.

In the preferred embodiment the memory controller interface is able to interface to 16 MB, 32 MB or 64 MB NAND Flash chips with either an 8 or 16 bit data bus; and to 8 MB, 16 MB, 32 MB and 64 MB SDRAM chips with a 16-bit data bus. The Cache can be configured for up to 7 or 8 sets of cache data space, each $\frac{1}{32}$ of the file system size. The secondary power supply 180 must allow enough time to save modified sectors during the AutoSave routine, and the amount of power required for this will depend upon the device architecture and memory sizes.

The memory controller interface will thus transfer data from the SDRAM 118 to the NAND flash 116 during the following conditions:
  When directly requested by the host;
  When the cache is filled and the sector needs to be replaced and has been modified; or
  During the AutoSave sequence.

To transfer the data, the memory controller interface 200 will read the sector from SDRAM 118, encrypt and generate the error correction coding (ECC) check bits. The data, along with the check bits are written into an erased sector in the NAND flash 116.

For cache tracking of modified sectors in SDRAM 118, the Tag SRAM is a 64K by 4 bit SRAM containing a 3 bit Set number and a modified bit for each sector in NAND flash file system (each tag entry represents 2 sectors (1KB) for 512 Mb (64 MB) NAND flash or 1 sector for smaller NAND flash devices). The modified bit is set whenever the processor interface writes to the sector and the modified bit was previously clear. At the same time a counter tracking the number of modified sectors is incremented. The modified bit is cleared when a sector is evicted from SDRAM 118 to a write buffer in the AutoBuffer of Read/Write Buffer 212, and the counter tracking the number of modified sectors is decremented. An interrupt is generated when the number of modified sectors exceeds a programmable watermark, in which case the software must service the Directory FIFO by flushing some of the modified sectors in SDRAM or temporary buffers to NAND flash 116.

The Modified Sector counter keeps a running tally on the number of cached file system sectors that have been modified so that the number does not exceed the ability of AutoSave to write to NAND Flash on a power fail. The Modified Sector counter is incremented on a write to a cached sector that has the TagModified Sector bit updated from '0' to '1' (indicating a first write since the sector was loaded into SDRAM). The Modified Sector counter is decremented when a cached sector is transferred to a Write buffer in the AutoBuffer unit. Software is given a Modified Sector interrupt when the Modified Sector counter exceeds the Modified Sector Limit register. The interrupt is cleared when the Modified Sector counter is reduced to less than the Limit register by updating modified sectors to NAND flash 116. When the Tag Modified Sector bit is read clear on a write to a cache sector, the Tag entry must be written back with the Modified Sector bit set as the Modified Sector counter is incremented.

A 256×16 block of SRAM (Directory FIFO) is used to queue up the Directory list, i.e. the list of originating NAND Sector Addresses of file system cached sectors that have been modified. The entire block of memory is memory mapped and accessible without affecting the FIFO pointers, which are accessible via the Cache Control Module (CCM) registers. The number of modified cache sectors is the difference between the Write pointer and the Read pointer. On every occurrence of a write to an unmodified cached sector, the corresponding sector address will be pushed onto the FIFO. To reduce the number of modified cache entries, read the FIFO content pointed to by the FIFO read pointer, pop one entry out of the FIFO by writing to the FIFO read pointer, move that cache sector to NAND flash memory and invalidate the corresponding tag entry. If the algorithm decides not to evict the cache sector popped from the FIFO, the sector address may be pushed back onto the FIFO by writing the sector address to the FIFO write data register. Writing to the FIFO write data register increments the Write pointer; thus increasing the number of FIFO entries by one.

In order to reduce the burden on the secondary power supply 180 during the AutoSave procedure, a pre-interrupt saving procedure is provided whereby when potential power loss is detected the CCM 210 may flush the cache to prevent loss of data, by moving all modified cached data from SDRAM 118 to NAND flash memory 116 before power from the primary power supply 170 is lost. In this case, the software using the RWB 212 initiates each sector save by making a Cache Write Request and providing, in addition to the source SDRAM address, a destination NAND flash sector address. The RWB 212 services the request by loading the Read Buffer with one sector of data from the source SDRAM address location. When completed, the RWB 212 will then initiate a write request to the NAND flash interface controller 214 to transfer the contents of the Read Buffer to NAND flash memory 116.

An embodiment of the invention having been thus described in detail by way of example, it will be apparent to those skilled in the art that variations and modifications may be made without departing from the invention.

We claim:

1. A method of automatically saving data upon interruption of power from a primary power supply in a data processing device comprising a cache controller, a non-volatile memory device for storing data and retaining the stored data when the primary power supply is deactivated, and a volatile memory device for caching data from the non-volatile memory device when the primary power supply is activated, comprising:
    reading sectors of data from the non-volatile memory device and writing the data to a corresponding sector of the volatile memory device;
    modifying at least one sector of data stored in the volatile memory device;
    storing a directory list in the cache controller, the directory list associating the at least one sector of data stored in the volatile memory device with a corresponding location in the non-volatile memory device, the directory list further designating the at least one sector of data thus modified;
    detecting a power interruption in the primary power supply;
    enabling a secondary power supply upon detection of the power interruption in the primary power supply; and
    writing the at least one sector of data thus modified from the volatile memory device and the directory list from the cache controller to the non-volatile memory device while the secondary power supply is enabled and the primary power supply is interrupted.

2. The method of claim 1, further comprising initiating a reset of the data processing device only after the at least one sector of data thus modified and the directory list are written to the non-volatile memory device.

3. The method of claim 1, further comprising, prior to detecting the power interruption in the primary power supply, detecting when a predetermined limit of modified data in the volatile memory device has been reached or exceeded in the cache controller and writing the at least one sector of data from the volatile memory device to the non-volatile memory device to reduce the number of modified data sectors to below the predetermined limit.

4. The method of claim 1 wherein the non-volatile memory comprises a NAND flash memory device.

5. The method of claim 1 comprising maintaining in the cache controller at least one sector address register pointing to at least one erased block in the non-volatile memory device for storing the at least one sector of data written from the volatile memory device.

6. The method of claim 5, wherein the at least one sector address register points to a group of erased blocks.

7. The method of claim 5, wherein the at least one sector address register can be configured to point to one erased block or to a group of erased blocks.

8. The method of claim 1, further comprising writing the at least one sector of data thus modified from the volatile memory device to the non-volatile memory device before power from the primary power supply is interrupted.

9. In a data processing device comprising a primary power supply, a non-volatile memory device for storing data and retaining the stored data when the primary power supply is deactivated, and a volatile memory device for storing data from the non-volatile memory device when the primary power supply is activated, an automatic data saving system comprising:
    a memory controller component for controlling a flow of data between the non-volatile memory device and the volatile memory device and storing a directory list, the directory list associating at least one sector of data stored in the volatile memory device with a sector of data read from the non-volatile memory device, the directory list further designating the at least one sector of data as modified, when said sector of data is modified in the volatile memory device;

a secondary power supply enabled upon detection of a power interruption in the primary power supply, the secondary power supply providing electrical power sufficient to allow for data stored in the volatile memory device to be written to the non-volatile memory device, wherein the memory controller component controls the writing of the at least one sector of data thus modified from the volatile memory device and the directory list from the cache controller to the non-volatile memory device while the secondary power supply is enabled and the primary power supply is interrupted.

10. The automatic data saving system of claim 9 wherein the memory controller component assigns a tag to designate data stored in the volatile memory device as modified.

11. The automatic data saving system of claim 9, wherein the memory controller component is configured to initiate a reset of the data processing device only after the at least one sector of data thus modified and the directory list are written to the non-volatile memory device.

12. The automatic data saving system of claim 9 comprising a counter for detecting when a predetermined limit of modified sectors of data stored in the non-volatile memory device has been reached or exceeded, wherein before detection of the power interruption the at least one sector of data thus modified is written from the volatile memory device to the non-volatile memory device to reduce the number of modified sectors of data to below the predetermined limit.

13. The automatic data saving system of claim 9 wherein the non-volatile memory comprises a NAND flash memory device.

14. The automatic data saving system of claim 9 wherein the volatile memory comprises an SDRAM memory device.

15. The automatic data saving system of claim 9, wherein the memory controller component comprises at least one sector address register pointing to at least one erased block in the non-volatile memory device for storing the at least one sector of written from the volatile memory device.

16. The automatic data saving system of claim 15, wherein the at least one sector address register points to a group of erased blocks.

17. The automatic data saving system of claim 15, wherein the at least one sector address register can be configured to point to one erased block or to a group of erased blocks.

18. The automatic data saving system of claim 9, wherein the memory controller component is configured to write the at least one sector of data thus modified from the volatile memory device to the non-volatile memory device before power from the primary power supply is interrupted.

\* \* \* \* \*

UNITED STATES PATENT AND TRADEMARK OFFICE
CERTIFICATE OF CORRECTION

PATENT NO. : 7,634,688 B2
APPLICATION NO. : 10/960950
DATED : December 15, 2009
INVENTOR(S) : Madter et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1120 days.

Signed and Sealed this

Ninth Day of November, 2010

David J. Kappos
*Director of the United States Patent and Trademark Office*